(12) United States Patent
Lee et al.

(10) Patent No.: US 7,994,811 B2
(45) Date of Patent: Aug. 9, 2011

(54) TEST DEVICE AND SEMICONDUCTOR INTEGRATED CIRCUIT DEVICE

(75) Inventors: Sang-Jin Lee, Seoul (KR); Gin-Kyu Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 12/385,117

(22) Filed: Mar. 31, 2009

(65) Prior Publication Data

US 2010/0013513 A1    Jan. 21, 2010

(30) Foreign Application Priority Data

Jul. 17, 2008    (KR) .................. 10-2008-0069541

(51) Int. Cl.
*G01R 31/02* (2006.01)

(52) U.S. Cl. .................. 324/762.01; 324/765; 324/500; 324/750.3

(58) Field of Classification Search .................. 324/765, 324/500, 537, 750.15, 750.3, 762.01
See application file for complete search history.

(56) References Cited

U.S. PATENT DOCUMENTS 6,437,455 B2 * 8/2002 Mori et al. .................... 257/369
6,778,449 B2   8/2004 Breitwisch et al.
6,962,827 B1 * 11/2005 Furue et al. .................... 438/14

FOREIGN PATENT DOCUMENTS

| JP | 2006-302330 | 11/2006 |
| KR | 10-2003-0002247 | 1/2003 |

* cited by examiner

*Primary Examiner* — Thomas L Dickey
*Assistant Examiner* — Nikolay Yushin
(74) *Attorney, Agent, or Firm* — Harness, Dickey & Pierce, P.L.C.

(57) ABSTRACT

Test devices and integrated circuits with improved productivity are provided. In accordance with example embodiments, a test device may include a first test region with a first test element and a second test region with a second test element defined on a semiconductor substrate. The first test element may include a pair of first secondary test regions in the semiconductor substrate and a pair of first test gate lines. One of the first test gate lines may overlap one of the first secondary test regions and the other first test gate line may overlap the other first secondary test region. The second test element may include structures corresponding to the first test element except the second test element does not include structures corresponding to the pair of first secondary test regions and the pair of first test gate lines.

11 Claims, 8 Drawing Sheets

TEST DEVICE AND SEMICONDUCTOR INTEGRATED CIRCUIT DEVICE

PRIORITY STATEMENT

This application claims priority under 35 U.S.C. §119 to Korean Patent Application No. 10-2008-0069541, filed on Jul. 17, 2008, in the Korean Intellectual Property Office (KIPO), the entire contents of which are herein incorporated by reference.

BACKGROUND

1. Field

Example embodiments relate to a test device and a semiconductor integrated circuit device, and more particularly, to a test device and a semiconductor integrated circuit device having improved productivity.

2. Description of the Prior Art

A static random access memory (hereinafter referred to as an SRAM) has a memory capacity that is relatively smaller than that of a dynamic random access memory (hereinafter referred to as a DRAM), but its operating speed is relatively higher than that of the DRAM. Accordingly, the SRAM is widely used as cache memory for computers requiring a high-speed operation and in portable appliances.

SRAM cells are classified into thin film transistor (TFT) cells and full complementary metal oxide semiconductor (FCMOS) cells. The full FCMOS cell includes a plurality of pull-up transistors and pull-down transistors that constitute a latch, and a plurality of pass transistors for accessing the latch.

With the integration of a semiconductor memory device, the size of a memory cell has gradually become smaller causing the size of metal contacts to also become smaller. As the size of the contacts becomes smaller, patterning the contacts accurately may become difficult, and thus, relatively inferior or defective contacts may be formed. Particularly, in the case of shared contacts formed on the SRAM cells, bridges, through which adjacent shared contacts are electrically connected to each other, may be produced.

In order to determine whether bridges are produced between shared contacts, nodes, which are connected to the respective adjacent shared contacts, are formed. A voltage may be applied to the nodes which may cause a current to flow from one node to another. However, current may flow between the nodes by other means, for example, a short circuit between adjacent active regions, a short circuit between a contact and a gate line, and/or a short circuit between nodes.

SUMMARY

Example embodiments are directed to a test device and a semiconductor integrated circuit with improved productivity.

In accordance with example embodiments, a test device may include a first test region and a second test region defined on a semiconductor substrate. The test device may include a first test element in the first test region and a second test element in the second test region. The first test element may include a pair of first secondary test regions in the semiconductor substrate extending in a first direction and a pair of first test gate lines on the semiconductor substrate extending in a second direction. One of the first test gate lines may overlap one of the first secondary test regions and the other first test gate line may overlap the other first secondary test region. The second test element may include structures corresponding to the first test element except the second test element does not include structures corresponding to the pair of first secondary test regions and the pair of first test gate lines.

In accordance with example embodiments at test device may include a first test region and a second test region defined on a semiconductor substrate. The first test region may include a first test element and the second test region may include a second test element. The first test element may include a pair of first test shared contacts. The second test element may include structures corresponding to the first test element except the second test element does not include structures corresponding to the pair of first test shared contacts.

In accordance with example embodiments, a semiconductor integrated circuit device may include a semiconductor substrate on which a first region, a second region, and a third region are defined. The semiconductor integrated circuit may include isolation regions in the first region, the second region, and the third region of the semiconductor substrate. The semiconductor integrated circuit may also include a plurality of active regions in the first region and the third region separated from one another by the isolation regions. A plurality of gate lines may be provided in the first region and the third region of the semiconductor substrate which may overlap a part of the active regions and a part of the isolation regions. An interlayer insulating layer may be provided in the first region, the second region, and the third region of the semiconductor substrate covering the whole surface of the semiconductor substrate. The semiconductor integrated circuit may also include a plurality of shared contacts in the first region and the second region penetrating the interlayer insulating layer, the shared contacts may contact the active regions and the gate lines in the first region may contact the isolation regions in the second region. In addition, the semiconductor integrated circuit may also include a plurality of nodes in the first region, the second region, and the third region, the nodes being electrically connected to the shared contacts on the interlayer insulating layer in the first region and the second region and being apart from the gate lines and the active regions on the interlayer insulating layer in the third region.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 is a circuit diagram of an SRAM cell of a semiconductor integrated circuit device according to example embodiments;

FIG. 2 is a layout diagram of an SRAM cell region of a semiconductor integrated circuit device according to example embodiments;

FIG. 6 is a view explaining test effects of a semiconductor integrated circuit device according to example embodiments.

DETAILED DESCRIPTION OF EXAMPLE EMBODIMENTS

Figure 1:
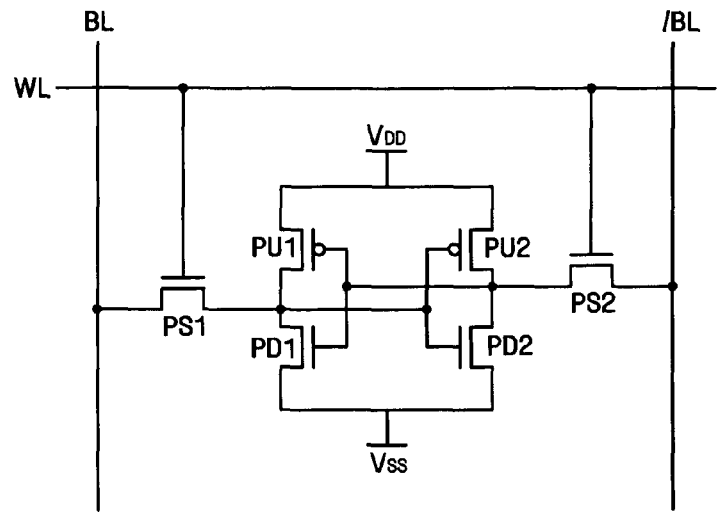

Hereinafter, example embodiments will be described in detail with reference to the accompanying drawings. The aspects and features of example embodiments and methods for achieving the aspects and features will be apparent by referring to example embodiments described in detail with reference to the accompanying drawings. However, example embodiments are not limited to the embodiments disclosed hereinafter, but can be implemented in many forms. The matters defined in the description, such as the detailed construction and elements, are nothing but specific details provided to assist those of ordinary skill in the art in a comprehensive understanding of example embodiments, and example embodiments are only defined within the scope of the appended claims. In example embodiments, well-known processes, structures, and technologies may not described in detail since they would obscure example embodiments in unnecessary detail.

The term "connected to" or "coupled to" that is used to designate a connection or coupling of one element to another element includes both a case that an element is "directly connected or coupled to" another element and a case that an element is connected or coupled to another element via still another element. In this case, the term "directly connected to" or "directly coupled to" means that an element is connected or coupled to another element without intervention of any other element. In the entire description of example embodiments, the same drawing reference numerals are used for the same elements across various figures. Also, the term "and/or" includes the respective described items and combinations thereof.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be a second element, second component, or second section.

In the following description of example embodiments, the terms used are for explaining example embodiments, but do not limit the scope of example embodiments. In the description, a singular expression may include a plural expression unless specially described. The term "comprises" and/or "comprising" used in the description means that one or more other components, steps, operation and/or existence or addition of elements are not excluded in addition to the described components, steps, operation and/or elements.

Unless specially defined, all terms (including technical and scientific terms) used in the description could be used as meanings commonly understood by those ordinary skilled in the art to which example embodiments belong. In addition, terms that are generally used but are not defined in the dictionary are not interpreted ideally or excessively unless they have been clearly and specially defined.

Spatially relative wordings "below", "beneath", "lower", "above", "upper", and so forth, as illustrated in the drawings, may be used to facilitate the description of relationships between an element or constituent elements and another element or other constituent elements. The spatially relative wordings should be understood as wordings that include different directions of the element in use or operation in addition to the direction illustrated in the drawings. For example, if an element illustrated in the drawing is stated reversely, the element described to be "below" or "beneath" another element may be put "above" the another element. Accordingly, the exemplary wording "below" may include both directions corresponding to "below" and "above". An element may be aligned in a different direction, and thus the spatially relative wordings may be interpreted according to the alignment of the element.

A semiconductor integrated circuit device according to example embodiments includes a static random access memory (SRAM) cell region and a test region defined on a semiconductor substrate.

Hereinafter, with reference to FIGS. 1 and 2, the structure of an SRAM cell region of a semiconductor integrated circuit device according to example embodiments will be described in detail.

FIG. 1 is a circuit diagram of an SRAM cell of a semiconductor integrated circuit device according to example embodiments. Referring to FIG. 1, a semiconductor integrated circuit device according to example embodiments may include an SRAM cell. The SRAM cell may include a plurality of pull-up transistors PU1 and PU2, a plurality of pull-down transistors PD1 and PD2, and a plurality of pass transistors PS1 and PS2.

A unit cell of the SRAM cell may be provided with first and second pass transistors PS1 and PS2, first and second pull-down transistors PD1 and PD2, and first and second pull-up transistors PU1 and PU2. The first and second pass transistors PS1 and PS2 and the first and second pull-down transistors PD1 and PD2 may be NMOS transistors, and the first and second pull-up transistors PU1 and PU2 may be PMOS transistors. The first and second pull-down transistors PD1 and PD2 may be connected to a ground line VSS, and the first and second pull-up transistors PU1 and PU2 may be connected to a power line VDD.

In accordance with example embodiments, a unit cell of an SRAM cell may include a first inverter and a second inverter. The first inverter may include a first pull-down transistor PD1 that is a NMOS transistor and a first pull-up transistor PU1 that is a PMOS transistor as illustrated in FIG. 1. The second inverter may be similarly formed by a second pull-down transistor PD2 that is an NMOS transistor and the second pull-up transistor PU2 that is a PMOS transistor as illustrated in FIG. 1.

The first and second inverters may include output terminals connected to the sources of the first and second pass transistors PS1 and PS2, respectively. A latch circuit may be formed by connecting the input terminal of the first inverter to the output terminal of the second inverter and the output terminal of the first inverter to the input terminal of the second inverter. Also, drains of the first and second pass transistors PS1 and PS2 may be connected to first and second bit lines BL and /BL, respectively. The first and second pass transistors PS1 and PS2 may also be connected to a word line WL as shown in FIG. 1.

Figure 2:
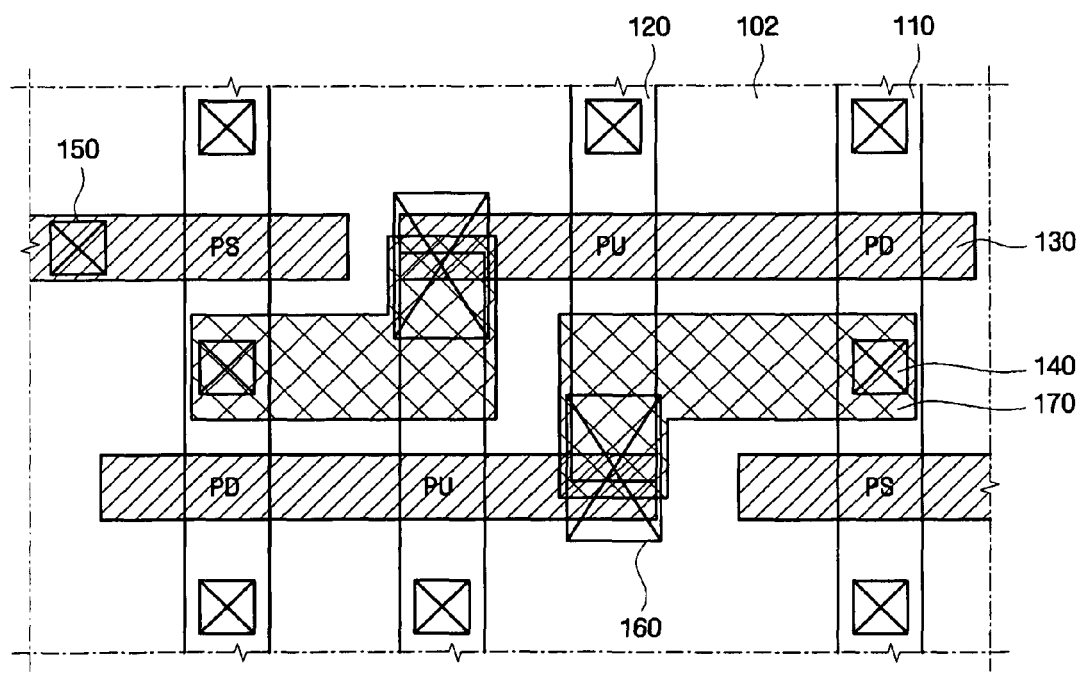

FIG. 2 is a layout diagram of an SRAM cell region of a semiconductor integrated circuit device according to example embodiments. Referring to FIG. 2, in a cell region of an SRAM device, a plurality of first conductive type active regions 110 may be formed apart from each other with isolation regions 102 intervening between them. As shown in FIG. 2, the plurality of first conductive type active regions 110 may extend in a first direction. Second conductive type active regions 120 may be formed apart from the first conductive type active regions 110. As shown in FIG. 2, the second conductive type active regions 120 may be parallel to the first conductive type active regions 110 and may extend in the first direction. The second conductive type active region 120 may have a length shorter than the first conductive type active region 110, however, example embodiments are not limited thereto. For example, the second conductive type active region 120 may have a length longer than the first conductive type active region 110. In accordance with example embodiments, the first conductive type active region 110 may be a N type active region and the second conductive type active region 120 may be a P type active region, however, example embodiments are not limited thereto.

A plurality of gate lines 130 may be formed to cross the first conductive type active regions 110 and/or the second conductive type active regions 120. The plurality of gate lines 130 may extend in a second direction. For example, as shown in FIG. 2, the plurality of gate lines 130 may extend in a direction perpendicular to the first direction. The plurality of gate lines 130 may be formed to extend in the second direction and may be adjacent to one another in the first direction. One end of the gate line 130 may be formed to be adjacent to the first conductive type active region 110 or the second conductive type active region 120 or to partially or fully overlap the first conductive type active region 110 and/or the second conductive type active region 120.

As shown in FIG. 2, the plurality of gate lines 130 may partially overlap the first conductive type active regions 110 or the second conductive type active regions 120 to form transistors. A transistor formed in a region that overlaps the first conductive type active region 110 may be an N type transistor, for example, a pull-down transistor (PD) or a pass transistor (PS). A transistor formed in a region that overlaps the second conductive type active region 120 may be a P type transistor, for example, a pull-up transistor (PU). The transistors indicated as PS, PU, and PD in FIG. 2, may constitute an SRAM cell.

On both sides of a region where the first conductive type active region 110 or the second conductive type active region 120 overlaps the plurality of gate lines, source/drain regions may be formed, and on parts of the source/drain regions, a plurality of first contacts 140 may be formed. The plurality of first contacts 140 may be configured to connect the source/drain regions to upper wirings. Also, on parts of the gate lines 130, second contacts 150 may be formed, and a voltage may be applied to the gate lines 130 through the second contacts 150.

Shared contacts 160 may be formed to extend over upper ends of the gate lines 130 adjacent to the second conductive type active regions 120 and upper surfaces of the second conductive type active regions 120. At one end of a pair of second conductive type active regions 120 adjacently formed, a pair of shared contacts 160 may be formed. The shared contact 160 may have a long axis and a short axis, and the pair of shared contacts 160 may be adjacently formed in a direction of their short axes.

On upper surfaces of the first conductive type active regions 110 and the second conductive type active regions 120 which do not overlap the gate lines 130 and on upper parts of the gate lines 130, silicide layers may be formed. The silicide layer may reduce the contact resistance of the first contacts 140, the second contacts 150, and the shared contacts 160.

On an upper part of an interlayer insulating layer (not illustrated) for burying the semiconductor substrate on which the shared contacts 160 are formed, nodes 170 may be formed. The nodes 170 may be electrically connected to the corresponding shared contacts 160, respectively. Through these nodes 170, a voltage may be applied to the shared contacts 160. As shown in FIG. 2, the nodes 170 may be "L" shaped. However, example embodiments are not limited thereto. For example, the nodes 170 may be rectangular or polygon shaped.

Figure 3A:
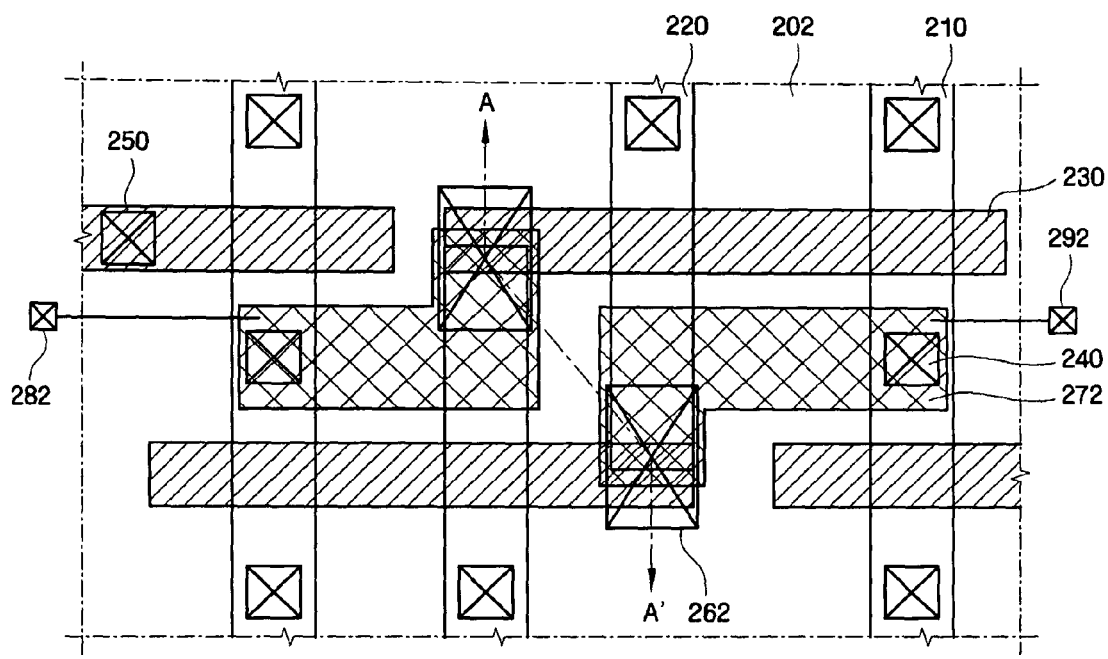
FIG. 3A is a layout diagram of a first test region of a semiconductor integrated circuit device according to example embodiments.
Figure 3B:
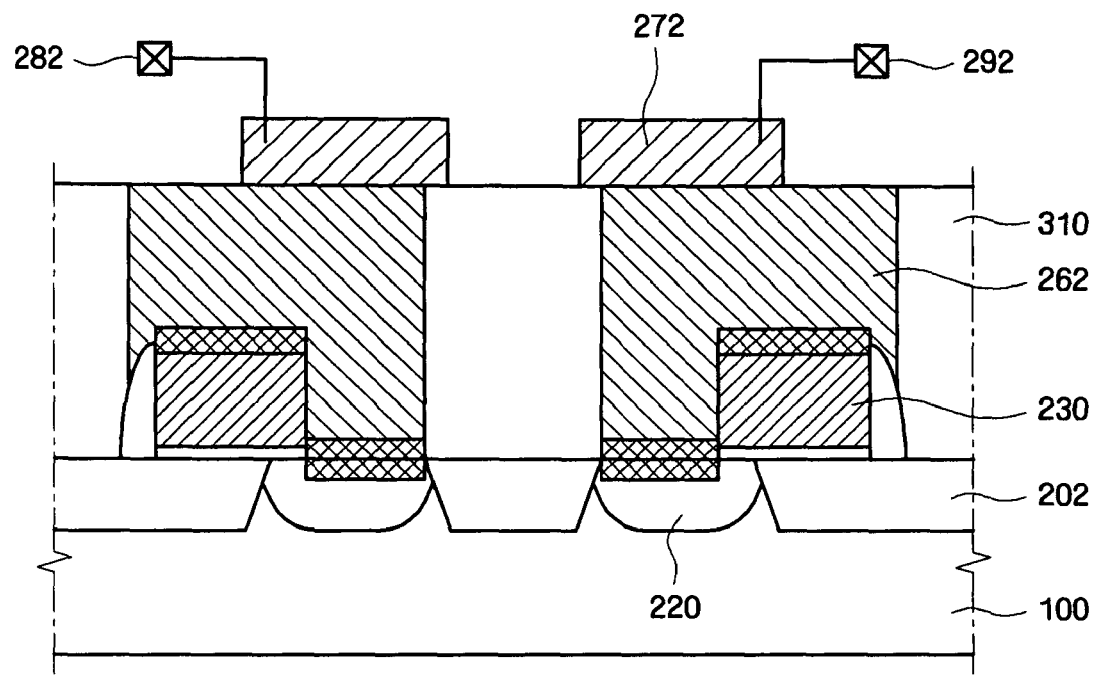
FIG. 3B is a sectional view taken along line A-A' of FIG. 3A.
Figure 4A:
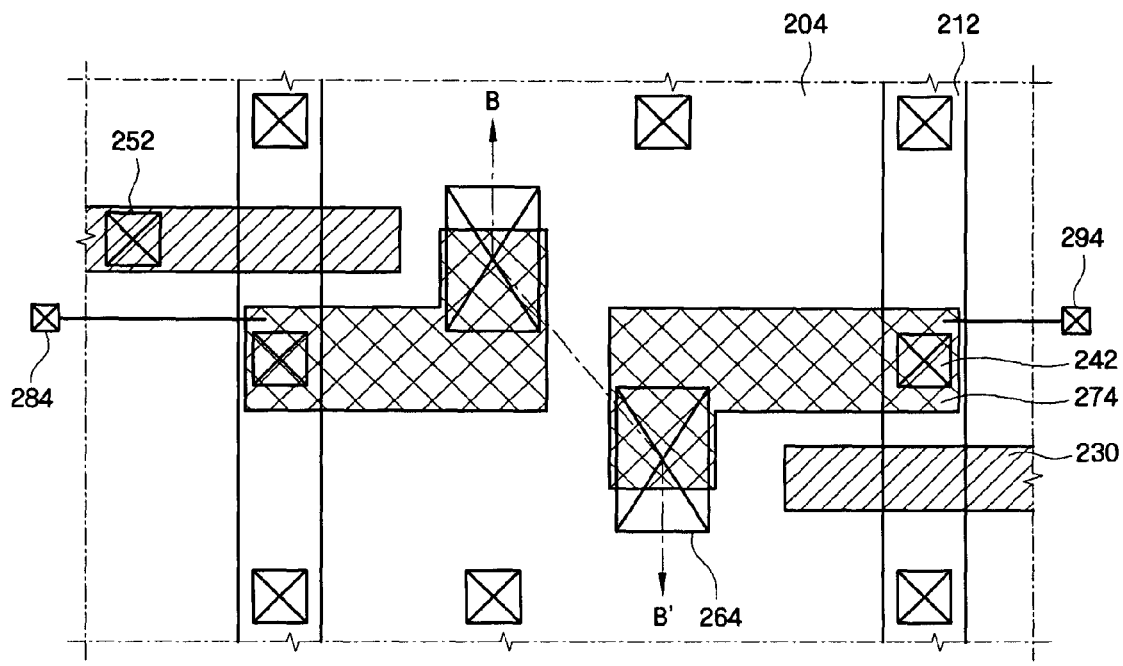
FIG. 4A is a layout diagram of a second test region of a semiconductor integrated circuit device according to example embodiments.
Figure 4B:
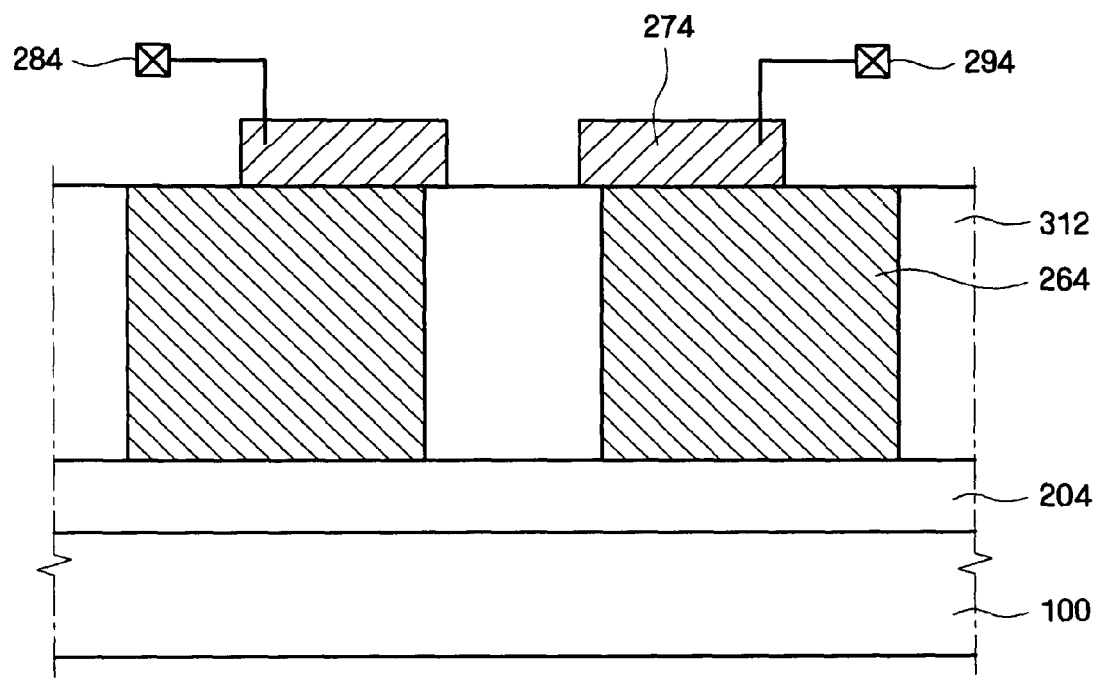
FIG. 4B is a sectional view taken along line B-B' of FIG. 4A.
Figure 5A:
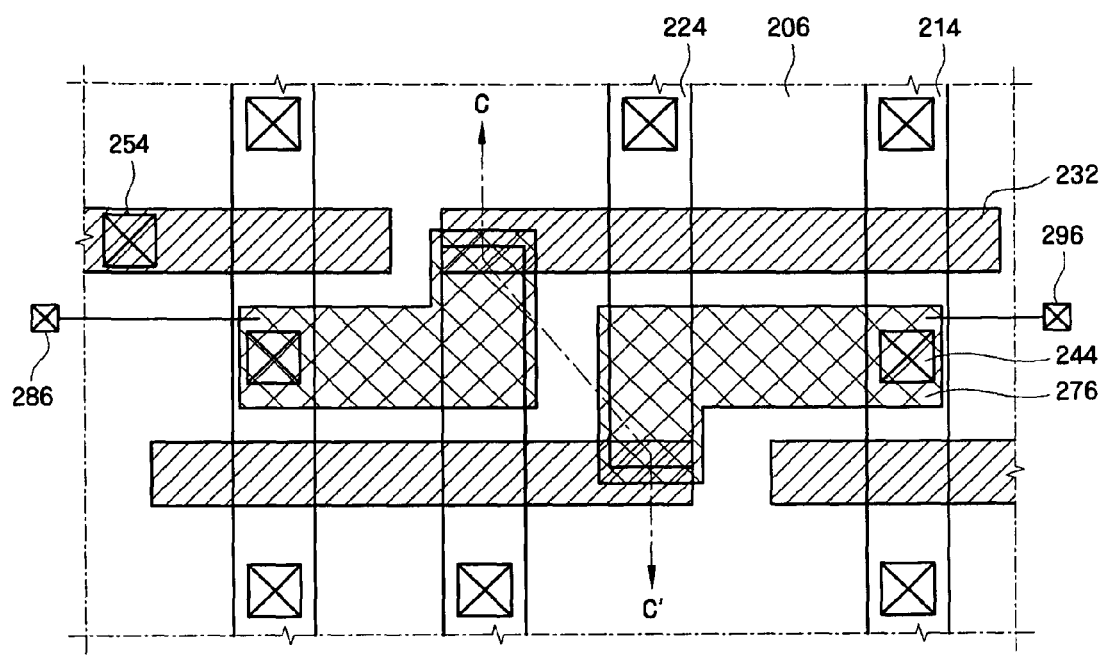
FIG. 5A is a layout diagram of a third test region of a semiconductor integrated circuit device according to example embodiments.
Figure 5B:
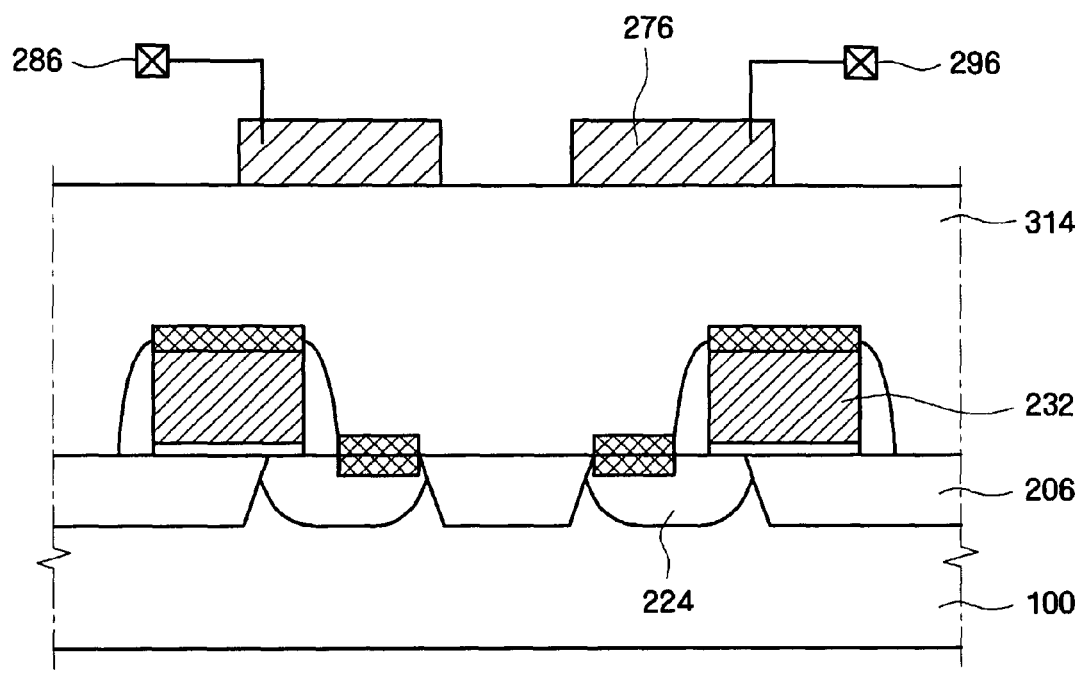
FIG. 5B is a sectional view taken along line C-C' of FIG. 5A.

Hereinafter, with reference to FIGS. 2 to 5B, the structure of a test region of a semiconductor integrated circuit device according to example embodiments will be described. FIG. 3A is a layout diagram of a first test region of a semiconductor integrated circuit device according to example embodiments, and FIG. 3B is a sectional view taken along line A-A' of FIG. 3A. FIG. 4A is a layout diagram of a second test region of a semiconductor integrated circuit device according example embodiments, and FIG. 4B is a sectional view taken along line B-B' of FIG. 4A. FIG. 5A is a layout diagram of a third test region of a semiconductor integrated circuit device according to example embodiments, and FIG. 5B is a sectional view taken along line C-C' of FIG. 5A.

FIG. 2 illustrates an SRAM cell region in accordance with example embodiments. FIGS. 3A and 3B illustrate an example of a first test region, FIGS. 4A and 4B illustrate an example of a second test region, and FIGS. 5A and 5B illustrate an example of a third test region. Referring to FIGS. 2 and 3B, the first test region of the semiconductor integrated circuit device according to example embodiments may have the same layout as the SRAM cell region as illustrated in FIG. 2.

In the first test region, first primary test regions 210 and first secondary test regions 220 may be formed. For example, as shown in FIG. 3A, a pair of first primary test regions 210 and a pair of secondary test regions 220 may be formed in the first test region. In accordance with example embodiments, the first primary test regions 210 and first secondary test regions 220 may be conductive type test active regions. The first primary test regions 210 may be formed to be separated from each other by first isolating regions 202. The first primary test regions 210 and the first secondary test regions 220 may be formed to correspond to the first conductive type active regions 110 and the second conductive type active regions 120 of the SRAM cell region, respectively. The term "to correspond" means that intervals, sizes, material properties, and orientations of the regions are set to be equal to or substantially similar to each other.

Also, in the first test region, a plurality of first test gate lines 230 may be formed to cross the first primary test regions 210 and the first secondary test regions 220. For example, as shown in FIG. 3A, a pair of first test gate lines 230 may be provided in the first test region. As shown in FIG. 2, the first primary test regions 210 and the first secondary test regions 220 may extend in a first direction. The plurality of first test gate lines 230 may be formed to extend in a second direction that may be perpendicular to the first direction. Further, the plurality of first test gate lines 230 may be adjacent to each another in the first direction. The plurality of first test gate lines 230 may be formed to correspond to the plurality of gate lines 130 of the SRAM cell region.

On one end of at least a part of the plurality of first test gate lines 230, a plurality of first test shared contacts 262 may be formed. For example, as shown in FIG. 3A, a pair of first test shared contacts 262 may be provided in the first test region. The plurality of first test shared contacts 262 may be formed to correspond to the plurality of shared contacts 160 of the SRAM cell region. Each of the first test shared contacts 262 may have a long axis and a short axis, and the respective first test shared contacts 262 may be adjacent to each other in a direction of the short axis. Contacts 240 and 250 may be formed on the first test region and may correspond to the first contact 140 and the second contact 150 of the SRAM cell region.

On an upper part of an interlayer insulating layer 310 that buries the semiconductor substrate 100 on which the first test shared contacts 262 may be formed, first test nodes 272 may be formed. For example, as shown in FIG. 3A, a pair of test nodes 272 may be provided in the first test region. The first test nodes 272 may be formed to correspond to nodes 170 that may be formed on the SRAM cell region.

Within the first test region, the first primary test regions 210, the first secondary test regions 220, the first test gate lines 230, the first test shared contacts 262, and the first test nodes 272 may form a test element, for example, a first test element in the first test region. First current measurement parts may be connected to the first test nodes 272. The first current measurement parts may include a first input pad 282 for making current flow through one of a pair of adjacent first test nodes 272, and a first output pad 292 for measuring whether the current is detected from the other first test node 272. Accordingly, by applying a voltage to the first test node 272 connected to one of a pair of adjacent first test shared contacts 262 and measuring whether a current change is detected from the first test node 272 connected to the other first test shared contact 262, whether the adjacent first test shared contacts 262 are bridged may be determined.

Referring to FIGS. 3A to 4B, the second test region illustrated in FIG. 4A, unlike the first test region, does not have secondary test regions and test gate lines. Except for the secondary test regions and the test gate lines, the second test region has the same layout as the first test region. Accordingly, the second test region may be formed to have the same layout as the first test region except for the SRAM cell region, the secondary test regions, and the gate lines.

In the second test region, in the same manner as the first test region, the second primary test regions 212 may be formed to be separated from each other by second isolation regions 204. Like the first primary test region 210, the second primary test region 212 may be a conductive type test active region and may correspond to the first conductive type active region 110. As shown in FIG. 4A, a pair of second primary test regions 212 may be provided in the second test region. However, in the second test region second secondary test regions may not be formed, and the isolation regions 204 may be formed in a region of the second test region corresponding to the first secondary test regions of the first test region.

In the second test region, no conductive pattern may be formed in a region where the first test gate lines 230 may be formed as in the first test region. As illustrated in FIG. 4B, the region of the second test region corresponding to the first test gate lines 230 of the first test region, is buried in the interlayer insulating layer 312.

In a region corresponding to the first test shared contacts 262 of the first test region, second test shared contacts 264 may be formed. The second test shared contacts 264 may be formed on upper parts of the isolation regions 204. As shown in FIG. 4A, a pair of second test shared contacts 264 may be provided in the second test region.

On the second test shared contacts 264, second test nodes 274 for applying a voltage to the second test shared contacts 264 may be formed. The second test nodes 274 may be formed to correspond to the first test nodes 272. As shown in FIG. 4A, the second test shared contacts 264 may be provided as a pair of second test shared contacts 264 in the second test region.

Second current measurement parts may be connected to the second test nodes 274. The second current measurement parts may include a second input pad 284 for making current flow through one of a pair of adjacent second test nodes 274, and a second output pad 294 for measuring whether the current is detected from the other second test node 274 illustrated in FIG. 4A.

Accordingly, by applying a voltage to the second test node 274 connected to one of a pair of adjacent second test shared contacts 264 and measuring whether a current change is detected from the second test node 274 connected to the other second test shared contact 264, it may be determined whether the adjacent second test shared contacts 264 are bridged.

Within the second test region, the second primary test regions 212, the second test shared contacts 264, and the second test nodes 274 may form a test element, for example, a second test element in the second test region. Contacts 242 and 252 may be formed in the second test region and may correspond to the contacts 240 and 250 in the first region. Further, as shown in FIG. 4A, the first test gate lines 230 from the first test region may overlap the second primary test regions 212 of the second test regions. However, example embodiments are not limited thereto. For example, the first test gate lines 230 of the first test region may not intrude upon the second test region and may not overlap the second primary test regions 212.

Referring to FIGS. 3A, 3B, 5A and 5B, the third test region, unlike the first test region, does not have shared contacts. Except for the test shared contacts, the third test region may have the same layout as the first test region. Accordingly, the third test region may be formed to have the same layout as the first test region except for the SRAM cell region and the shared contacts.

In the third test region, in the same manner as the first test region, the third primary test regions 214 and the third secondary test regions 224 may be formed to be separated from each other by the isolation regions 206. For example, as shown in FIG. 5A, a pair of third primary test regions 214 and a pair of third secondary test regions 224 are provided in the third test region. In accordance with example embodiments, the third primary test regions 214 and the third secondary test regions 224 may be conductive type test active regions and may correspond to the first primary test regions 210 and the first secondary test regions 220 of the first test region. Also, in the third test region, third test gate lines 232 may be formed in the same manner as the first test gate lines 230 formed in the first test region. For example, as shown in FIG. 5A, the third test region may include a pair of third test gate lines 232.

However, in the third test region, no conductive pattern is formed in a region corresponding to the first test shared contacts 262 of the first test region. As illustrated in FIG. 5B, the region corresponding to the first test shared contacts 262 of the first test region is buried by the interlayer insulating layer 314. On the upper part of the interlayer insulating layer 314, third test nodes 276 may be formed. The third test nodes 276 may be formed to correspond to the first test nodes 272.

Third current measurement parts may be connected to the third test nodes 276. The third current measurement parts may include a third input pad 286 for making current flow through one of a pair of adjacent third test nodes 276, and a third output pad 296 for measuring whether the current is detected from the other third test node 276.

Accordingly, by applying a voltage to the third test node 276 and measuring whether a current change is detected from the other third test node 276, whether the adjacent third test nodes 276 are bridged may be determined. Within the third test region, the third primary test regions 214, the third secondary test regions 224, the third test gate lines 232, and the third test nodes 276 may form a test element, for example, a third test element in the third region. The third region may also include contacts 244 and 254 that may correspond to contacts 240 and 250 in the first region.

Figure 6:
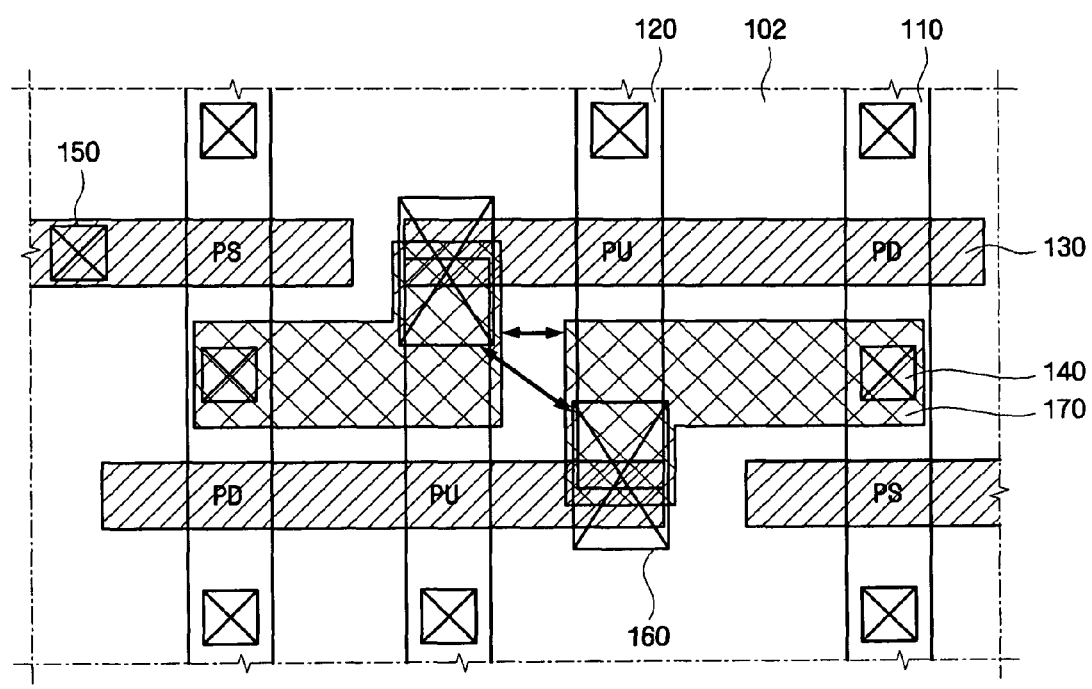

FIG. 6 is a view explaining test effects of a semiconductor integrated circuit device according to example embodiments. Referring to FIGS. 2 to 6, variables related to short circuits between adjacent nodes in an SRAM cell region of a semiconductor integrated circuit device are diverse. That is, if adjacent nodes are short-circuited, it may be difficult to determine which structure is causing the trouble.

Referring to FIG. 6, arrows indicate cases where a shared contact 160 or a node 170 exerts an effect when the adjacent nodes 170 are short-circuited. In the case where a pair of adjacent shared contacts 160 or a pair of adjacent nodes 170 is connected to each other, current may flow between the nodes 170. The semiconductor integrated circuit device according to example embodiments may include a first test region, a second test region, and a third test region.

By applying a voltage from a first input pad 282 to one of a pair of adjacent first test nodes 272 in the first test region, and measuring, through a first output pad 292, whether current flow is detected from the first test node 272, whether the first test nodes 272 are short-circuited may be determined.

By applying a voltage from a second input pad 284 to one of a pair of adjacent second test nodes 274 in the second test region, and measuring, through a second output pad 294, whether current flow is detected from the second test node 274, whether the second test nodes 274 are short-circuited may be determined.

By applying a voltage from a third input pad 286 to one of a pair of adjacent third test nodes 276 in the third test region, and measuring, through a third output pad 296, whether current flow is detected from the third test node 276, whether the third test nodes 276 are short-circuited may be determined.

The second test region may not include secondary test regions or test gate lines similar to the first secondary test regions 220 or the first test gate lines 230 of the first test region. Therefore, a short circuit of the second test nodes 274 cannot be blamed on a secondary test region similar to the first secondary test region 220 or test gate lines similar to the first test gate lines 230. The third test region may not include shared contacts similar to the first shared contacts 262 of the first test region. Therefore, a short circuit of the third test nodes 276 cannot be blamed on shared contacts similar to the first shared contacts 262 of the first test region.

If the first test nodes 272 are short-circuited, but the second test nodes 274 are not short-circuited, the short circuit of the first test nodes 272 may be caused by the first secondary test region 220 or the first test gate lines 230, because the second test region may have the same structure as the first test region, but structures similar to the first secondary test regions 220 and the first test gate lines 230 of the first test region are not formed in the second test region.

If both the first test nodes 272 and the second test nodes 274 are short-circuited, the short circuit of the first test nodes 272 in the first test region may be caused by the first test shared contacts 262 or the first test nodes 272. If the first test nodes 272 are short-circuited, but the third test nodes 276 are not short-circuited, the short circuit of the first test nodes 272 may be caused by the first test shared contacts 262, because the third test region may have the same structure as the first test region without test shared contacts similar to the first test shared contacts 262 formed in the first test region. Also, by measuring whether the second test nodes 274 and the third test nodes 276 are short-circuited, the effects of the shared contacts and the nodes may be measured.

According to the semiconductor integrated circuit device according to example embodiments, by measuring whether the first test nodes 272, the second test nodes 274, and the third test nodes 276 are short-circuited, respectively, whether the test shared contacts and/or the test nodes are the cause of a short circuit may be accurately measured.

In addition, the structure of the first test region, the second test region, and the third test region of the semiconductor integrated circuit device according to example embodiments may be formed to correspond to the structure of an SRAM cell region. Accordingly, whether the first test nodes 272, the second test nodes 274, and the third test nodes 276 are short-circuited may be reflected more accurately than whether the nodes 170 of the SRAM cell region are short-circuited. Accordingly, a more accurate test may be performed to improve the productivity of the device.

As described above, the test device and the semiconductor integrated circuit device according to example embodiments have the following effects. According to the test device and the semiconductor integrated circuit device according to example embodiments, if a pair of nodes is short-circuited, whether the short circuit is caused by the test shared contacts or the nodes may be accurately measured.

For example, by accurately recognizing whether the short circuit is caused by the test shared contacts or the nodes and reflecting the result of recognition in the SRAM cell region, the productivity of the device may be improved.

While example embodiments have been particularly shown and described with reference to example embodiments thereof, it will be understood by those of ordinary skill in the art that various changes in form and details may be made therein without departing from the spirit and scope of the following claims.

What is claimed is:
1. A test device comprising:
 a first test region and a second test region defined on a semiconductor substrate;
 a first test element in the first test region, the first test element including a pair of first secondary test regions in the semiconductor substrate extending in a first direction and a pair of first test gate lines on the semiconductor substrate extending in a second direction, wherein one of the first test gate lines overlaps one of the first secondary test regions and the other first test gate line overlaps the other first secondary test region; and
 a second test element in the second test region, wherein the second test element includes structures corresponding to structures of the first test element except the second test element does not include structures corresponding to the pair of first secondary test regions and the pair of first test gate lines, wherein
 the first test element further includes,
  a pair of first primary test regions in the semiconductor substrate extending in the first direction, wherein one of the first primary test regions is separated from the other first primary test region by an isolation region and both of the first primary test regions are separated from the pair of first secondary test regions,
  a pair of first test shared contacts, wherein one of the first test shared contacts is at least partially on one of the first test gate lines and one of the first secondary test regions and the other first test shared contact is at least partially on the other first test gate line and the other first secondary test region,
  a pair of first test nodes, wherein one of the first test nodes is electrically connected to one of first test shared contacts and the other first test node is electrically connected to the other first test shared contact, and a first current detection part configured to measure a current between the pair of first test nodes, and the second test element includes a pair of second primary test regions in the semiconductor substrate, wherein one of the second primary test regions is separated from the other second primary test region by an isolation region and the pair of second primary test regions corresponds to the pair of first primary test regions, a pair of second test shared contacts corresponding to the pair of first test shared contacts, and a pair of second test nodes, wherein one of the second test nodes is electrically connected to one of the second test shared contacts and the other second test node is electrically connected to the other of the second test shared contacts and the pair of second test nodes corresponds to the pair of first test nodes of the first test element.

2. The test device of claim 1, wherein the second test element further includes a second current detection part configured to measure a current between the pair of second test nodes.

3. The test device of claim 1, wherein a leakage current through the first second primary test element is quantified by measuring a current between the pair of first test nodes and measuring a current between the pair of second test nodes.

4. The test device of claim 1, further comprising:

a third test region defined on the semiconductor substrate; and a third test element in the third test region, wherein the third test element includes structures corresponding to the first test element except the third test element does not include structures corresponding to the pair of first test shared contacts, the third test element including a pair of third primary test regions in the semiconductor substrate corresponding to the pair of first primary test regions, a pair of third secondary test regions corresponding to the pair of first secondary test regions, a pair of third test gate lines corresponding to the pair of first test gate lines, and a pair of third test nodes corresponding to the pair of first test nodes.

5. The test device of claim 4, wherein the third test element further includes a third current detection part configured to measure current between the pair of third test nodes.

6. The test device of claim 1, further comprising:

an SRAM cell region defined in the semiconductor substrate, wherein the SRAM cell region includes first conductive type active regions corresponding to the pair of first primary test regions of the first test element, second conductive type active regions corresponding to the pair of first secondary test regions of the first test element, gate lines corresponding to the pair of first test gate lines of the first test element, first shared contacts corresponding to the pair of first test shared test contacts of the first test element, and first nodes corresponding to the pair of first test nodes of the first test element.

7. A test device comprising:

a first test region and a second test region defined on a semiconductor substrate;

a first test element in the first test region, the first test element including a pair of first test shared contacts; and a second test element in the second test region, wherein the second test element includes structures corresponding to the first test element except the second test element does not include structures corresponding to the pair of first test shared contacts, wherein the first test element further includes a pair of first primary test regions in the semiconductor substrate extending in a first direction, wherein one of the first primary test regions is separated from the other first primary test region by an isolation region, a pair of first secondary test regions in the semiconductor substrate extending in the first direction, wherein both of the of the first secondary test regions are separated from the pair of first primary test regions, a pair of first test gate lines on the semiconductor substrate extending in a second direction, wherein one of the first test gate lines overlaps one of the first secondary test regions and the other first gate line overlaps the other first secondary test region and one of the first test shared contacts is at least partially on one of the first test gate lines and one of the first secondary test regions and the other first test shared contact is at least partially on the other first test gate line and the other first secondary test region, a pair of first test nodes, wherein one of the first test nodes is electrically connected to one of first test shared contacts and the other first test node is electrically connected to the other first test shared contact, and a first current detection part configured to measure a current between the pair of first test nodes, and the second test element includes a pair of second primary test regions in the semiconductor substrate to corresponding to the pair of first primary test regions, a pair of second secondary test regions corresponding to the pair of first secondary test regions, a pair of second test gate lines corresponding to the pair of first test gate lines, and a pair of second test nodes corresponding to the pair of first test nodes.

8. The test device of claim 7, wherein the second test element further includes a second current detection part configured to measure current between the pair of second test nodes.

9. The test device of claim 7, further comprising:

a third test region defined on the semiconductor substrate; and a third test element in the third test region with structures corresponding to the first test region except the third test element does not include structures corresponding to the pair of first secondary test regions and the pair of first test gate lines, the third test element including a pair of third primary test regions in the semiconductor substrate, wherein one of the third primary test regions is separated from the other third primary test region by an isolation region and the pair of third primary test regions corresponds to the pair of first primary test regions, a pair of third test shared contacts corresponding to the pair of first test shared contacts, and a pair of third test nodes, wherein one of the third test nodes is electrically connected to one of third test shared contacts and the other third test node is electrically connected to the other third test shared contact.

10. The test device of claim 9, wherein the third test element further includes a third current detection part configured to measure a current between the pair of third test nodes.

11. The test device of claim 7, further comprising:
an SRAM cell region defined in the semiconductor substrate, wherein the SRAM cell region includes first conductive type active regions corresponding to the pair of first primary test regions, second conductive type active regions corresponding to the pair of first secondary test regions, gate lines corresponding to the pair of first test gate lines, shared contacts corresponding to the pair of first test shared contacts, and nodes corresponding the pair of first test nodes in the first test region.

* * * * *